United States Patent
Kobayashi

(10) Patent No.: US 10,476,610 B2
(45) Date of Patent: Nov. 12, 2019

(54) SEMICONDUCTOR INTEGRATED CIRCUIT, SEMICONDUCTOR SYSTEM, AND ELECTRIC SOURCE VOLTAGE CONTROL METHOD

(71) Applicant: NEC Corporation, Minato-ku, Tokyo (JP)

(72) Inventor: Hideaki Kobayashi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 45 days.

(21) Appl. No.: 15/862,887

(22) Filed: Jan. 5, 2018

(65) Prior Publication Data

US 2018/0212691 A1   Jul. 26, 2018

(30) Foreign Application Priority Data

Jan. 20, 2017   (JP) .................. 2017-008111

(51) Int. Cl.
| | |
|---|---|
| *H04B 15/00* | (2006.01) |
| *H02M 1/36* | (2007.01) |
| *G11C 5/14* | (2006.01) |
| *G06F 1/3296* | (2019.01) |
| *G11C 7/06* | (2006.01) |

(Continued)

(52) U.S. Cl.
CPC ..... *H04B 15/005* (2013.01); *G01R 19/16552* (2013.01); *G01R 31/40* (2013.01); *G06F 1/3296* (2013.01); *G11C 5/147* (2013.01); *G11C 7/06* (2013.01); *H01L 27/02* (2013.01);
(Continued)

(58) Field of Classification Search
CPC .................................................. H04B 15/005
See application file for complete search history.

(56) References Cited

U.S. PATENT DOCUMENTS 5,345,184 A * 9/1994 Andoh ................. G01N 27/185
324/706
5,376,830 A * 12/1994 Ashley ................. H02M 3/156
327/134
(Continued)

FOREIGN PATENT DOCUMENTS

| | | |
|---|---|---|
| JP | H10-56071 A | 2/1998 |
| JP | 2006-508531 A | 3/2006 |

(Continued)

OTHER PUBLICATIONS

Japanese Office Action for JP Application No. 2017-008111 dated Nov. 14, 2017 with English Translation.
(Continued)

*Primary Examiner* — Adam D Houston

(57) ABSTRACT

A semiconductor integrated circuit includes a voltage comparison circuit and a control circuit. The voltage comparison circuit compares a detection voltage with a reference voltage. The detection voltage is a detected result of an electric source voltage supplied from an electric source supply device supplying the electric source voltage. The reference voltage is set to be lower than a standard voltage used in stabilization control that the electric source supply device performs for stabilizing the electric source voltage. The control circuit performs control of compensating a voltage drop of the electric source voltage when the detection voltage is lower than the reference voltage based on a result of comparison by the voltage comparison circuit.

3 Claims, 10 Drawing Sheets

(51) Int. Cl.
- *H01L 27/02* (2006.01)
- *G01R 19/165* (2006.01)
- *H03F 1/30* (2006.01)
- *G01R 31/40* (2014.01)

(52) U.S. Cl.
CPC .............. *H02M 1/36* (2013.01); *H03F 1/305* (2013.01); *H01L 2924/14* (2013.01)

(56) References Cited

U.S. PATENT DOCUMENTS

| | | | |
|---|---|---|---|
| 5,939,780 A | 8/1999 | Inoue | |
| 2002/0060560 A1* | 5/2002 | Umemoto | H02M 3/156 323/288 |
| 2006/0061340 A1* | 3/2006 | Wang | H02M 3/156 323/267 |
| 2006/0091941 A1 | 5/2006 | Pineda De Gyvez et al. | |
| 2006/0285418 A1 | 12/2006 | Aoki | |
| 2007/0145986 A1 | 6/2007 | Alie | |
| 2008/0001629 A1* | 1/2008 | Martiny | H03K 17/00 326/82 |
| 2008/0088997 A1 | 4/2008 | So | |
| 2008/0211313 A1 | 9/2008 | Nakamura | |
| 2009/0058514 A1 | 3/2009 | Sato | |
| 2011/0068855 A1 | 3/2011 | Ikenaga | |
| 2012/0249094 A1 | 10/2012 | Zhao et al. | |
| 2013/0063206 A1 | 3/2013 | Hirairi | |
| 2013/0082611 A1* | 4/2013 | Cohen | H05B 33/0815 315/185 R |
| 2014/0105610 A1* | 4/2014 | Azadeh | H05B 33/0812 398/135 |
| 2014/0254213 A1* | 9/2014 | Matthews | H02M 3/33523 363/21.15 |
| 2014/0266118 A1* | 9/2014 | Chern | H02M 3/156 323/283 |
| 2015/0362944 A1* | 12/2015 | Sporck | G05F 5/00 323/303 |
| 2018/0212691 A1* | 7/2018 | Kobayashi | H04B 15/005 |

FOREIGN PATENT DOCUMENTS

| | | |
|---|---|---|
| JP | 2006-351633 A | 12/2006 |
| JP | 2007-514296 A | 5/2007 |
| JP | 2008-107971 A | 5/2008 |
| JP | 2008-197892 A | 8/2008 |
| JP | 2009-064921 A | 3/2009 |
| JP | 2010-507289 A | 3/2010 |
| JP | 2011-066791 A | 3/2011 |
| JP | 2013-062569 A | 4/2013 |
| JP | 2015-088652 A | 5/2015 |

OTHER PUBLICATIONS

Japanese Office Action for JP Application No. 2017-008111 dated Jan. 16, 2018 with English Translation.

* cited by examiner

SEMICONDUCTOR INTEGRATED CIRCUIT, SEMICONDUCTOR SYSTEM, AND ELECTRIC SOURCE VOLTAGE CONTROL METHOD

This application is based upon and claims the benefit of priority from Japanese Patent Application No. 2017-008111, filed on Jan. 20, 2017, the disclosure of which is incorporated herein in its entirety by reference.

TECHNICAL FIELD

The present invention relates to a technique for reducing a sharp voltage noise of electric source voltage inside a semiconductor integrated circuit.

BACKGROUND ART

To a semiconductor integrated circuit, an electric source voltage depending on an operation voltage thereof needs to be supplied. For example, as illustrated in FIG. 6, a semiconductor integrated circuit 50 is connected to an electric source output part and a feedback voltage input part of an external direct-current/direct-current (DC/DC) converter 60. The DC/DC converter 60 outputs an output voltage V2 as an electric source voltage to the semiconductor integrated circuit 50. In the semiconductor integrated circuit 50, the electric source voltage supplied to a load 70 is detected and fed back as a feedback voltage Vfbk to the DC/DC converter 60. The DC/DC converter 60 controls a circuit operation so as to stabilize the feedback voltage Vfbk at a standard voltage Vref1. Note that a circuit configuration of the illustrated DC/DC converter 60 is one example and is well known, and thus, description thereof is omitted.

In the example of FIG. 6, in the semiconductor integrated circuit 50, the electric source voltage supplied to the load 70 is detected, and this detected voltage is fed back as the feedback voltage Vfbk to the DC/DC converter 60. The feedback voltage Vfbk is not adversely affected by a wiring resistance R3 inside the semiconductor integrated circuit 50. For this reason, based on the feedback voltage Vfbk, the DC/DC converter 60 can stabilize the electric source voltage supplied to the load 70, without being adversely affected by the wiring resistance R3.

One example of a technique related to such the control of the electric source voltage is described in reference 1 (JP2008-197892A). In this technique, a series regulator includes an electric power adjustment unit adjusting input electric power and outputting the adjusted electric power to a load side, and an adjustment control unit detecting an output voltage and controlling the electric power adjustment unit. The series regulator controls input electric power input to the electric power adjustment unit, depending on an output current to the load side.

Further, another example of the technique related to the control of the electric source voltage is described in reference 2 (JP2015-88652A). In this technique, a semiconductor integrated circuit includes an electric source generation circuit, a function module, and a capacitor. The capacitor is arranged on the outer side of the electric source generation circuit. Further, one electrode of the capacitor is connected to an output portion of the electric source generation circuit, and another electrode is connected at a standard potential. The function module connects the electric source generation circuit via the capacitor. To the function module, an electric source voltage generated by the electric source generation circuit is supplied as an operation electric source voltage.

Furthermore, reference 3 (JP2010-507289A) describes one example of a technique for controlling a current, as the technique related to the control of the electric source voltage. In this technique, a current limit value of user setting is detected, and depending on the detection signal, a current is limited.

SUMMARY

In recent years, in order to suppress electric power consumption of a semiconductor integrated circuit, an electric source voltage supplied to the semiconductor integrated circuit has been required to be made constant voltage. For this reason, a noise included in the electric source voltage has to be suppressed to be small. Further, accompanying higher integration of a semiconductor integrated circuit, it becomes difficult to predict a peak current quantity due to switching of a circuit element. For this reason, a sharp current change larger than an allowable range is likely to occur in a semiconductor integrated circuit. When a voltage drop due to such the sharp current change occurs in a semiconductor integrated circuit, an external DC/DC converter may not follow the voltage drop. In this case, it is concerned that an unexpected voltage noise occurs in the semiconductor integrated circuit, and the voltage noise causes the semiconductor integrated circuit to malfunction.

This problem is described with reference to the drawings. As described above, in FIG. 6, based on the feedback voltage Vfbk and the standard voltage Vref1, the DC/DC converter 60 controls the output voltage V2 which is output to the semiconductor integrated circuit 50. Thereby, in the semiconductor integrated circuit 50, the voltage supplied to the load 70 is stabilized at a set value.

Herein, it is assumed that a current I1 flowing through the load 70 of the semiconductor integrated circuit 50 sharply changes as illustrated in FIG. 7. At this time, a current $I_{L1}$ flowing through an inductance L1 of the DC/DC converter 60 cannot sufficiently follow a sharp change of I1 as illustrated in FIG. 7. As a result, an output current to the semiconductor integrated circuit 50 is supplied from the capacitor C1 of the DC/DC converter 60. This matters causes a large voltage drop (i.e., a voltage noise) as illustrated in FIG. 8 to occur in a voltage $V_{70}$ supplied to the load 70 in the semiconductor integrated circuit 50. A compensation time period up to a time when such a voltage drop in the voltage $V_{70}$ is compensated by the DC/DC converter 60 is determined by a frequency fc at a time when a gain of a loop transfer function T(s) of the DC/DC converter 60 as illustrated in FIG. 9 becomes one (in other words, 0 dB). Therefore, the stability operation of the DC/DC converter 60 does not enable the compensation time period up to a time when the voltage drop is compensated to shorten, thus, it is difficult to reduce the voltage noise by shortening the compensation time.

Herein, in the technique described in reference 1, the series regulator outside the semiconductor integrated circuit controls the input voltage to the electric power adjustment unit. For this reason, it is difficult to reduce the voltage noise due to the sharp current change in the semiconductor integrated circuit, by using this technique.

Further, in order to remove the sharp voltage noise in the semiconductor integrated circuit by the capacitor by using the technique described in reference 2, a capacitor of large capacitance is needed. In this case, in this technique, a large inductance is generated on a line path to which the capacitor of large capacitance is connected. For this reason, it is difficult to reduce the sharp voltage noise in the semiconductor integrated circuit by using this technique.

Furthermore, since the technique described in reference 3 is a technique for controlling a current, it is difficult to apply the technique to reduction of the sharp voltage noise in the semiconductor integrated circuit.

The present invention has been made in order to solve the above-described problems. In other words, a main object of the present invention is to provide a technique for reducing a sharp voltage noise in a semiconductor integrated circuit.

A semiconductor integrated circuit according to an example aspect of the invention includes:

a voltage comparison circuit that compares a detection voltage with a reference voltage, the detection voltage being a detected result of an electric source voltage supplied from an electric source supply device supplying the electric source voltage, the reference voltage being set to be lower than a standard voltage used in stabilization control that the electric source supply device performs for stabilizing the electric source voltage; and a control circuit that performs control of compensating a voltage drop of the electric source voltage when the detection voltage is lower than the reference voltage based on a result of comparison by the voltage comparison circuit.

A semiconductor system according to an example aspect of the invention includes:

an electric source supply device that outputs an electric source voltage; and a semiconductor integrated circuit to which the electric source voltage is supplied from the electric source supply device, wherein the semiconductor integrated circuit includes:

a voltage comparison circuit that compares a detection voltage with a reference voltage, the detection voltage being a detected result of the electric source voltage supplied from the electric source supply device, the reference voltage being set to be lower than a standard voltage used in stabilization control that the electric source supply device performs for stabilizing the electric source voltage; and a control circuit that performs control of compensating a voltage drop of the electric source voltage when the detection voltage is lower than the reference voltage based on a result of comparison by the voltage comparison circuit.

An electric source voltage control method according to an example aspect of the invention includes:

comparing a detection voltage with a reference voltage, the detection voltage being a detected result of an electric source voltage supplied from an electric source supply device supplying the electric source voltage, the reference voltage being set to be lower than a standard voltage used in stabilization control that the electric source supply device performs for stabilizing the electric source voltage; and performing control of compensating a voltage drop of the electric source voltage when the detection voltage is lower than the reference voltage based on a result of comparison.

BRIEF DESCRIPTION OF THE DRAWINGS

Exemplary features and advantages of the present invention will become apparent from the following detailed description when taken with the accompanying drawings in which.

EXAMPLE EMBODIMENT

In the following, example embodiments of the present invention are described in detail with reference to the drawings.

Figure 1:
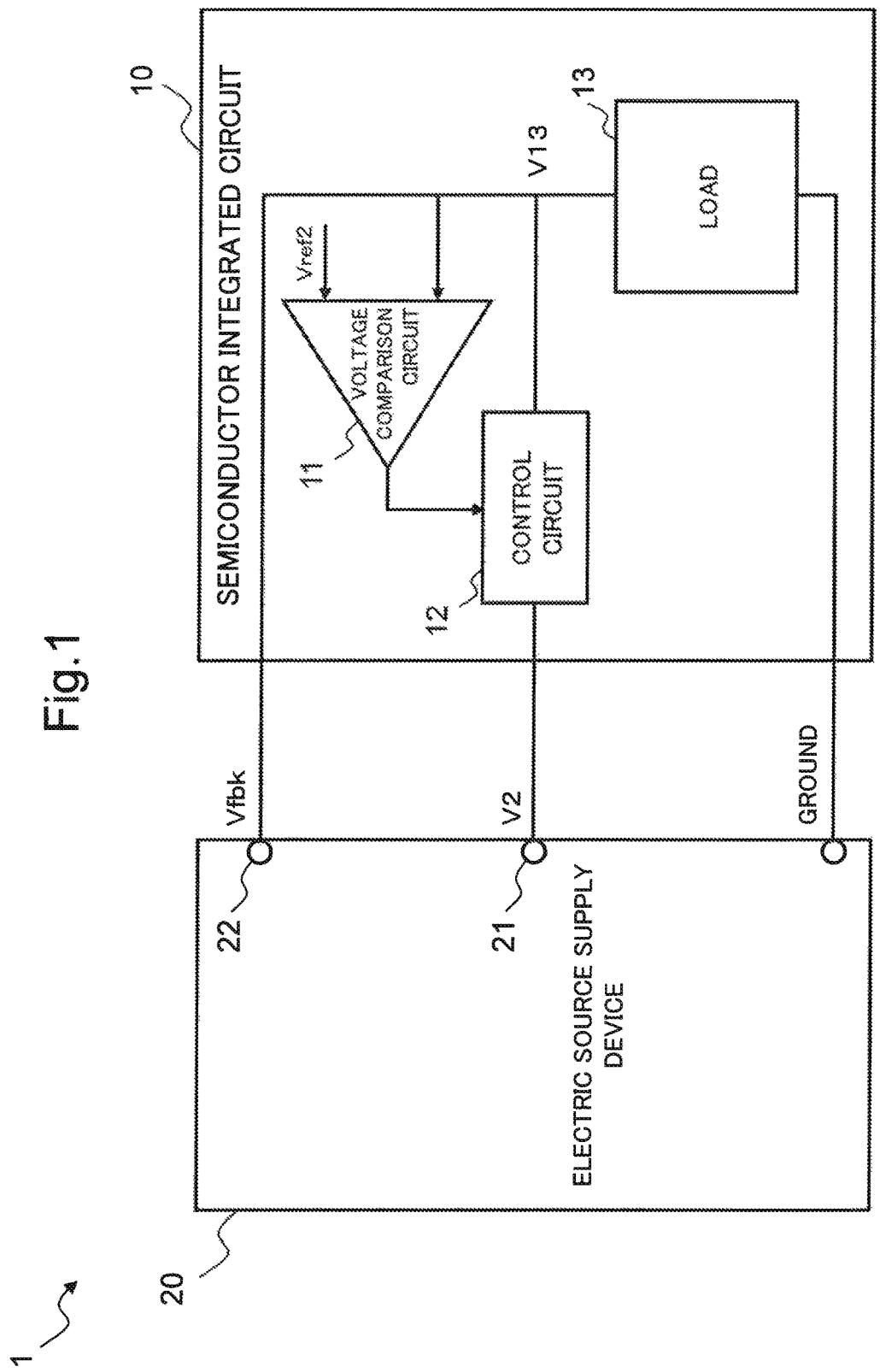
FIG. 1 is a block diagram illustrating a configuration of a semiconductor system as an example embodiment of the present invention.

First, FIG. 1 illustrates a configuration of a semiconductor system 1 as an example embodiment of the present invention. In FIG. 1, the semiconductor system 1 includes a semiconductor integrated circuit 10 and an electric source supply device 20. The semiconductor integrated circuit 10 is connected to an electric source output part 21 and a feedback voltage input part 22 of the electric source supply device 20.

The electric source supply device 20 outputs an output voltage V2 as an electric source voltage to the semiconductor integrated circuit 10 connected to the electric source output part 21. Further, the electric source supply device 20 controls the output voltage V2 based on a feedback voltage Vfbk input to the feedback voltage input part 22 from the semiconductor integrated circuit 10 and a standard voltage Vref1. Thereby, the electric source voltage supplied to a load 13 of the semiconductor integrated circuit 10 is controlled so as to be stabilized at a voltage according to the standard voltage Vref1. For example, the electric source supply device 20 can be configured by a DC/DC converter.

To the semiconductor integrated circuit 10, the electric source voltage is supplied from the electric source supply device 20. The electric source voltage supplied from the electric source supply device 20 is supplied to the load 13 of the semiconductor integrated circuit 10. The electric source voltage V13 supplied to the load 13 is detected as a detection voltage, and the detected detection voltage is fed back as a feedback voltage Vfbk to the electric source supply device 20.

The semiconductor integrated circuit 10 includes a voltage comparison circuit 11 and a control circuit 12.

The voltage comparison circuit 11 includes a circuit configuration of comparing the electric source voltage V13 supplied to the load 13 with a reference voltage Vref2. The reference voltage Vref2 is set as a value lower than the standard voltage Vref1. Specifically, the voltage comparison circuit 11 is constituted by a comparator. This comparator includes a circuit configuration to which the electric source voltage V13 and the reference voltage Vref2 are received and that outputs to the control circuit 12 a comparison result of the two received voltages. When a voltage noise lower than the reference voltage Vref2 occurs in the electric source voltage V13, the voltage comparison circuit 11 outputs a noise level to the control circuit 12. The noise level represents a degree at which the electric source voltage V13 is lower than the reference voltage Vref2.

The control circuit 12 controls the electric source voltage V13 based on the comparison result by the voltage comparison circuit 11. For example, the control circuit 12 controls the electric source voltage V13 in such a way to raise the electric source voltage V13 according to the noise level input from the voltage comparison circuit 11. Specifically, the control circuit 12 is constituted by a variable resistance. In this case, for example, a variable resistance that is adopted as the variable resistance constituting the control circuit 12 can be digitally controlled and vary a resistance value in such a way that the resistance value becomes smaller as the noise level supplied as the comparison result is larger. Such digitally controllable variable resistance can be easily implemented in the semiconductor integrated circuit 10.

Figure 2:
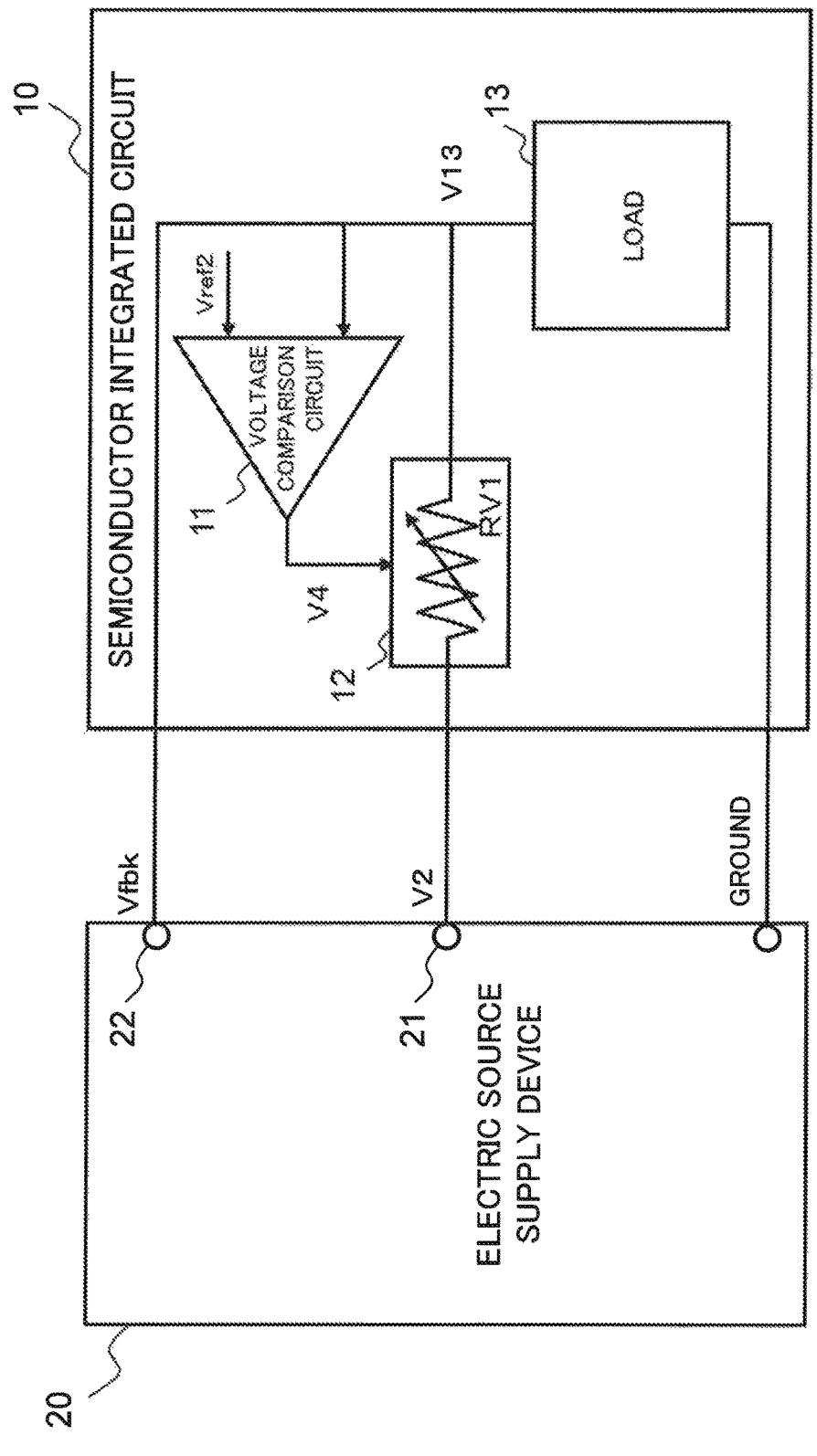
FIG. 2 is a diagram illustrating a specific example of a configuration of the semiconductor system as the example embodiment of the present invention.

An operation example of the semiconductor system 1 configured as described above is described. In this example, it is assumed that the control circuit 12 is constituted by a variable resistance RV1 as illustrated in FIG. 2.

Figure 3:
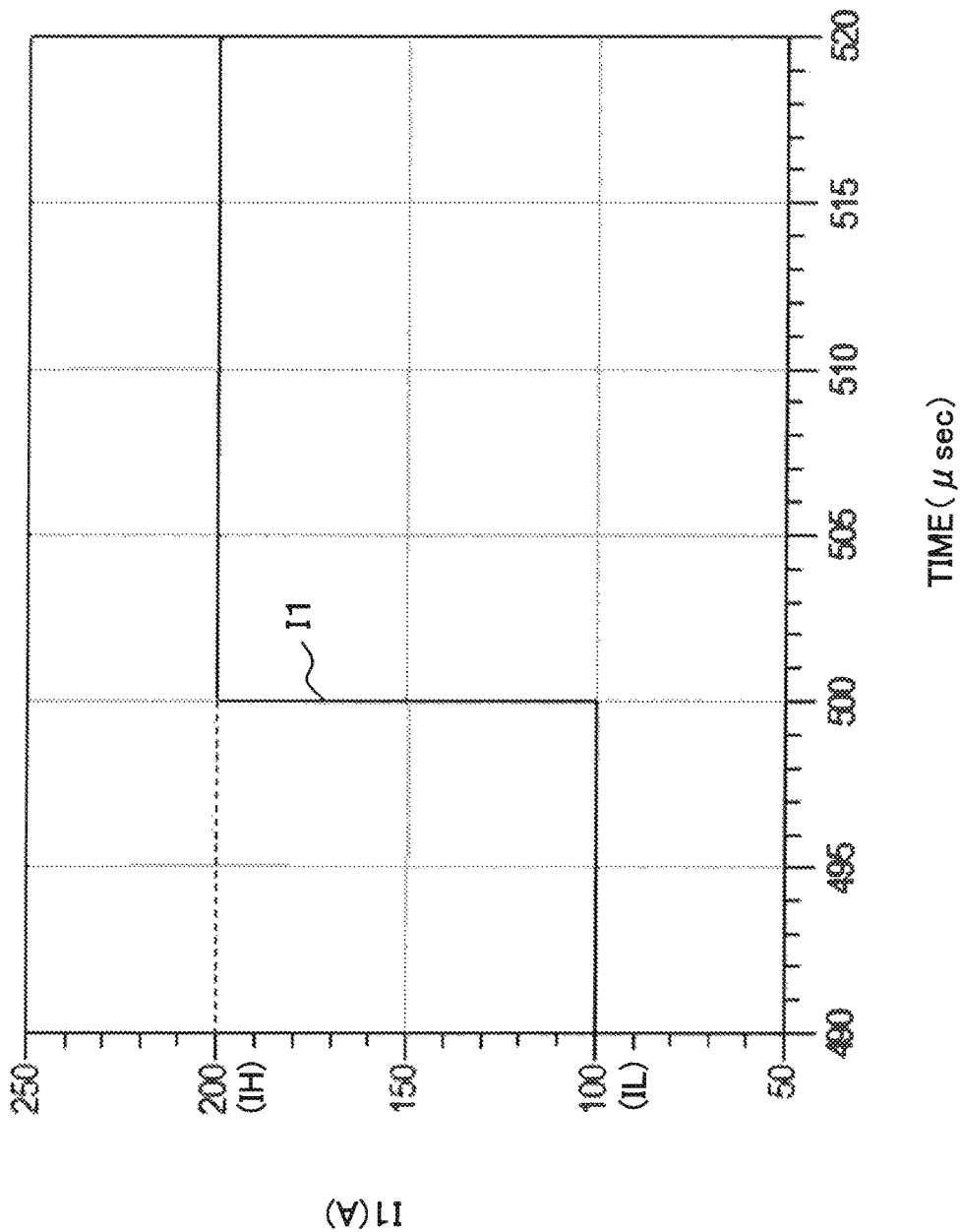
FIG. 3 is a diagram illustrating one example of sharp current change occurring in a semiconductor integrated circuit in the example embodiment of the present invention.
Figure 4:
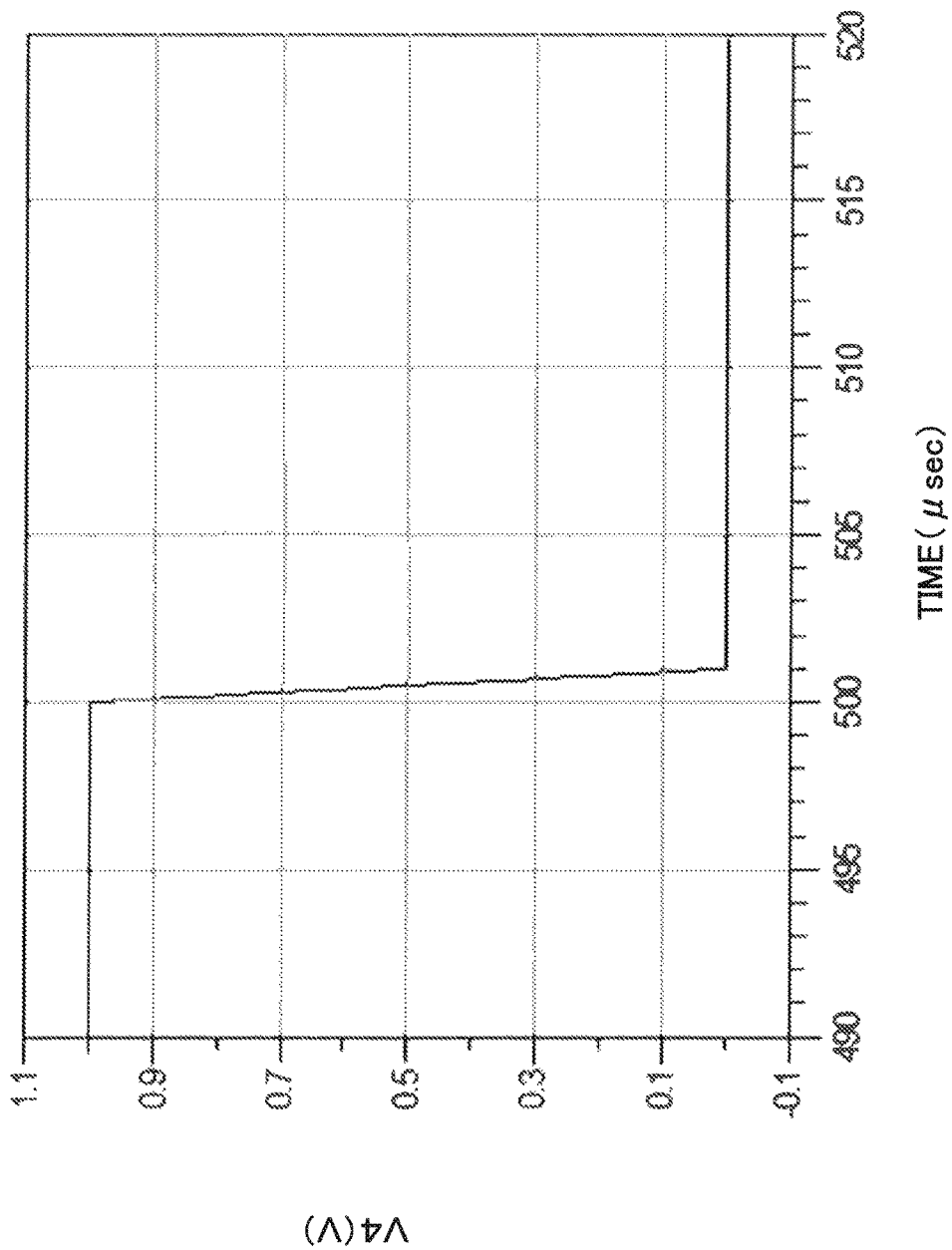
FIG. 4 is a diagram illustrating one example of a control voltage generated by a control circuit in the example embodiment of the present invention.

FIG. 3 illustrates one example of change of a current I1 flowing through the load 13 of the semiconductor integrated circuit 10. When the current I1 is at the IL level, the electric source voltage V13 in the semiconductor integrated circuit 10 is controlled in order to be kept at the standard voltage Vref1 by the electric source supply device 20. In this case, since the electric source voltage V13 is not lower than the reference voltage Vref2, the voltage comparison circuit 11 outputs to the control circuit 12 the comparison result representing that the electric source voltage V13 is not lower than the reference voltage Vref2. When the electric source voltage V13 is not lower than the reference voltage Vref2, the control circuit 12 keeps the resistance value of the variable resistance RV1 at the standard value RH.

Here, it is assumed that the current I1 changes from the IL level to an IH level illustrated in FIG. 3. Then, when the electric source supply device 20 cannot sufficiently follow this current change, the electric source voltage V13 declines once. Thereby, when the electric source voltage V13 becomes lower than the reference voltage Vref2, the voltage comparison circuit 11 outputs to the control circuit 12, as a result of comparison between the electric source voltage V13 and the reference voltage Vref2, the noise level representing the degree at which the electric source voltage V13 is lower than the reference voltage Vref2. Then, a control voltage V4 based on the noise level output from the voltage comparison circuit 11 is applied to the variable resistance RV1 of the control circuit 12. The control voltage V4 is a voltage that controls the variable resistance RV1. The application of the control voltage V4 changes the resistance value of the variable resistance RV1 from the standard value RH to a smaller resistance value RL. As a result, the electric source voltage V13 rises by I1×(RH−RL).

Figure 8:
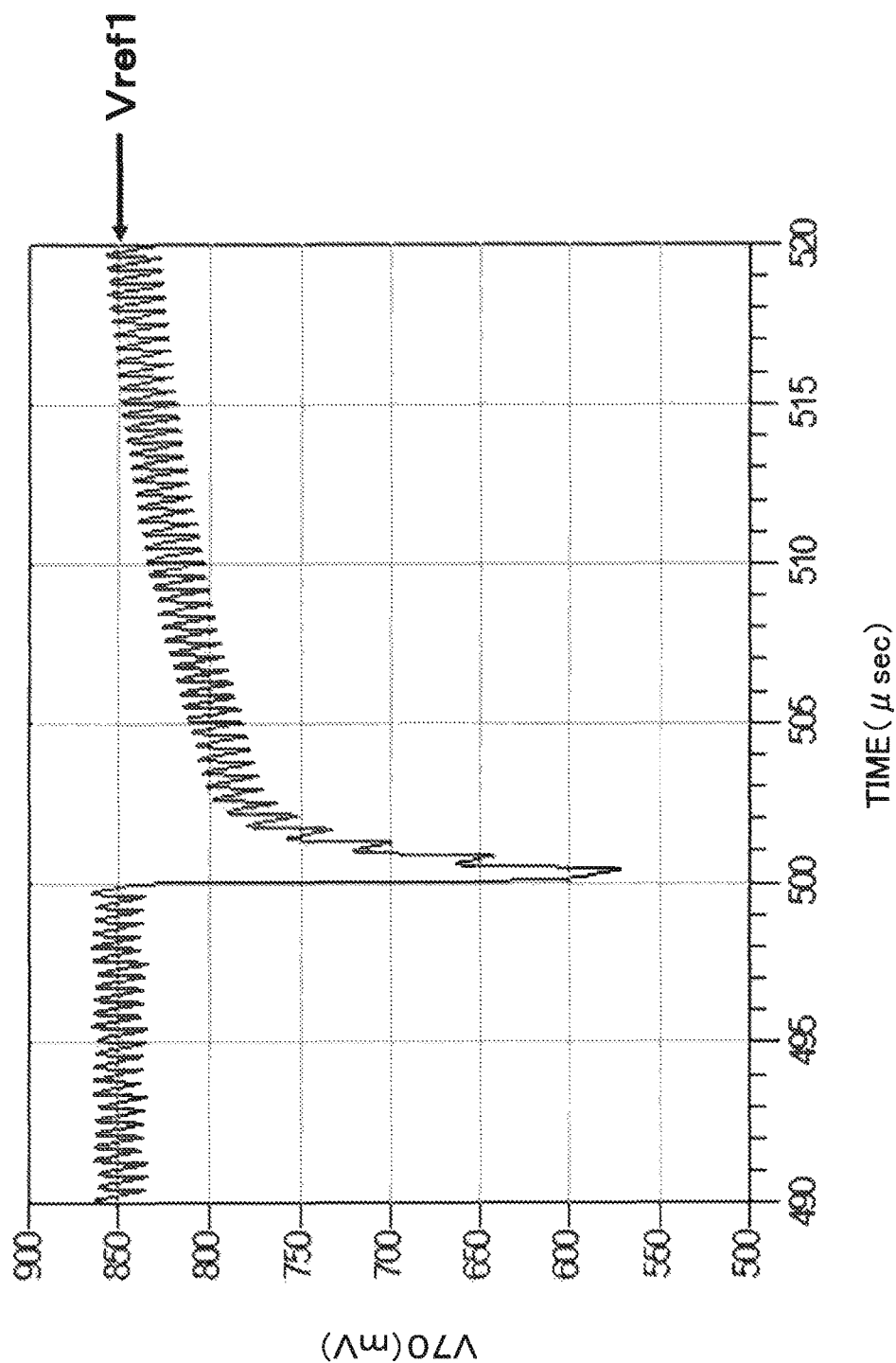
FIG. 8 is a diagram illustrating one example of a voltage noise occurring in the semiconductor integrated circuit in the general semiconductor system.
Figure 9:
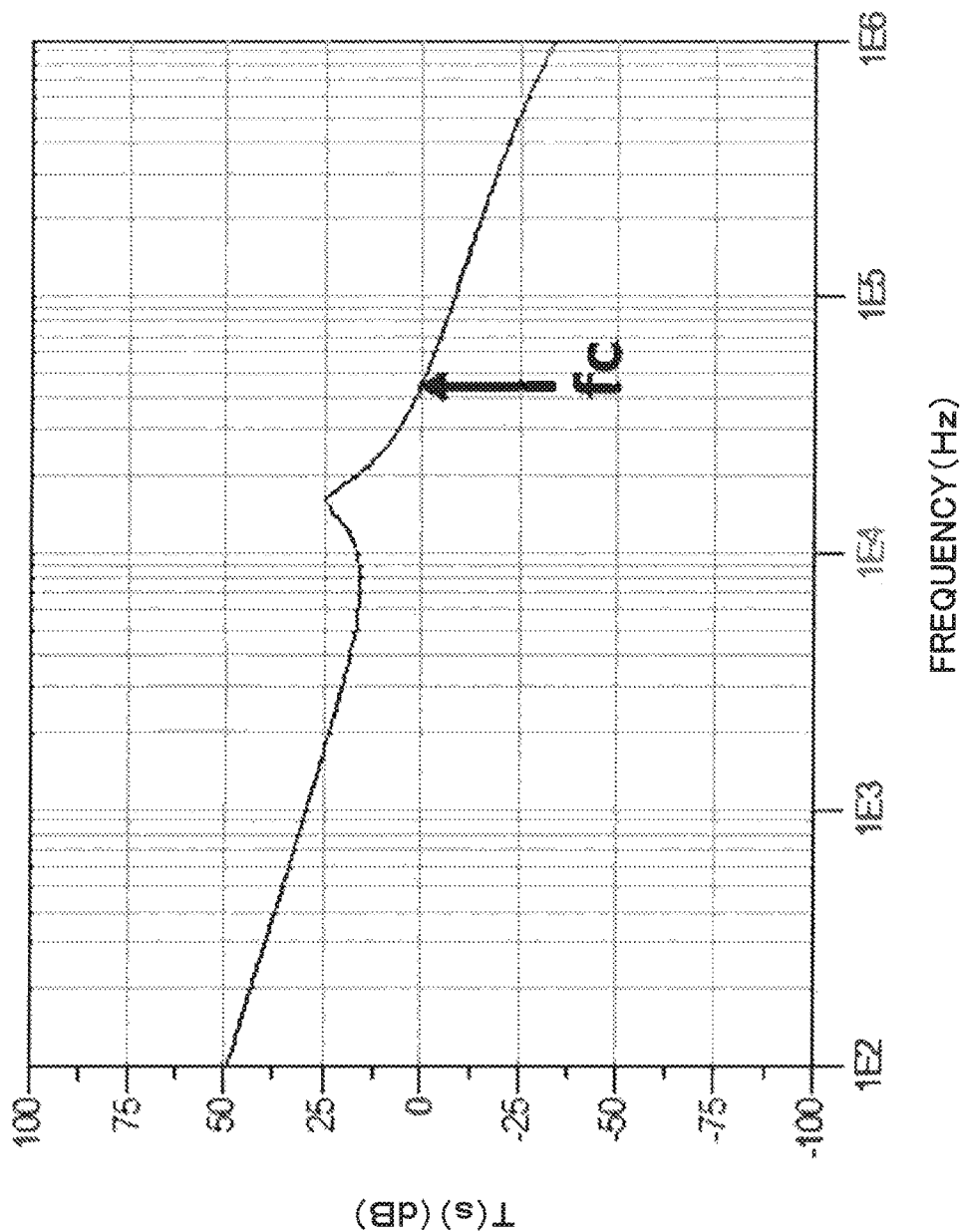
FIG. 9 is a diagram illustrating one example of a loop transfer function of the DC/DC converter in the general semiconductor system.

Meanwhile, when the semiconductor integrated circuit 10 does not include the voltage comparison circuit 11 and the control circuit 12, the electric source voltage V13 declines until the electric source supply device 20 starts compensation operation for the voltage drop (e.g., refer to FIG. 8).

Figure 5:
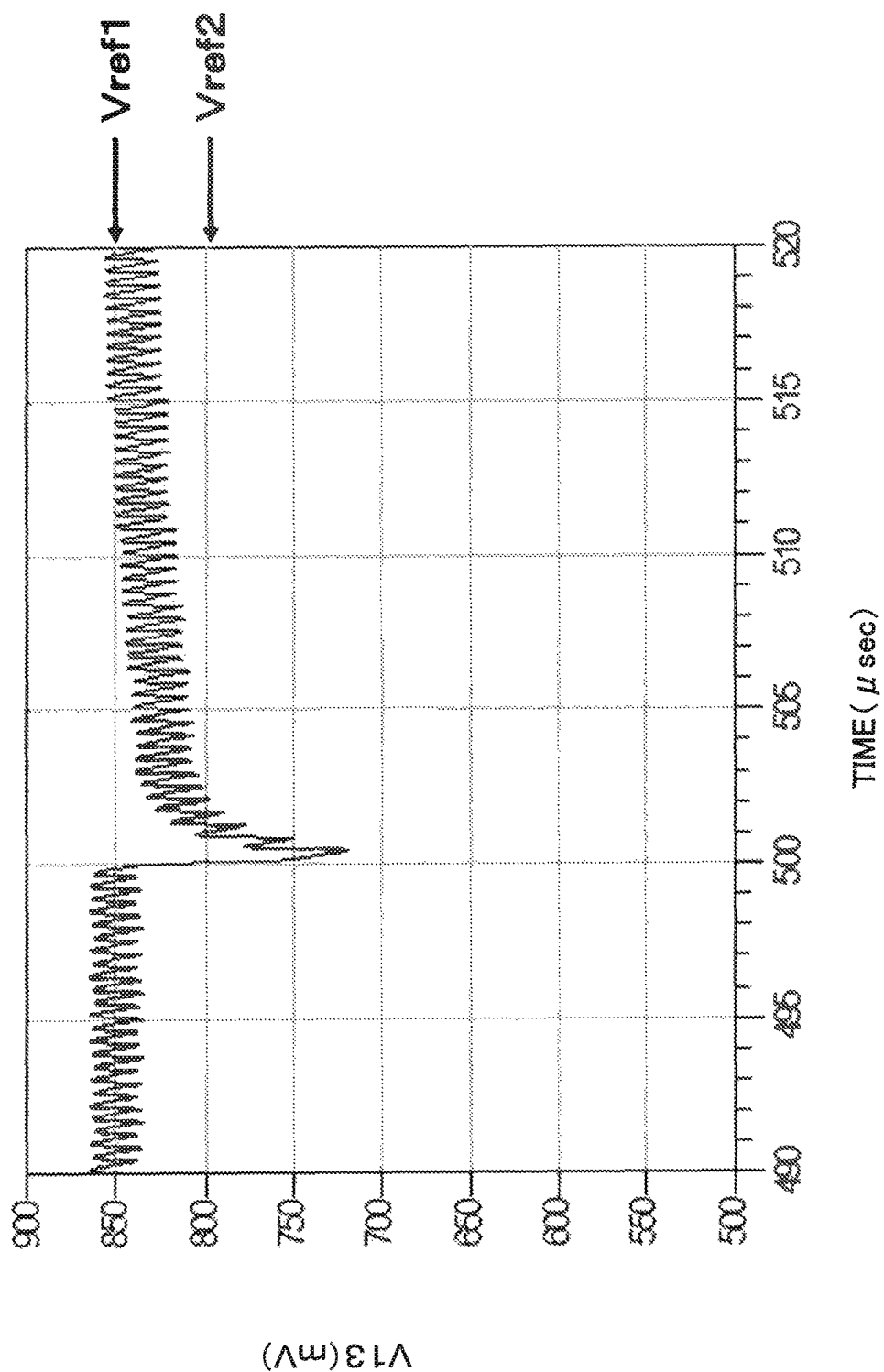
FIG. 5 is a diagram illustrating one example of an electric source voltage controlled in the example embodiment of the present invention.
Figure 6:
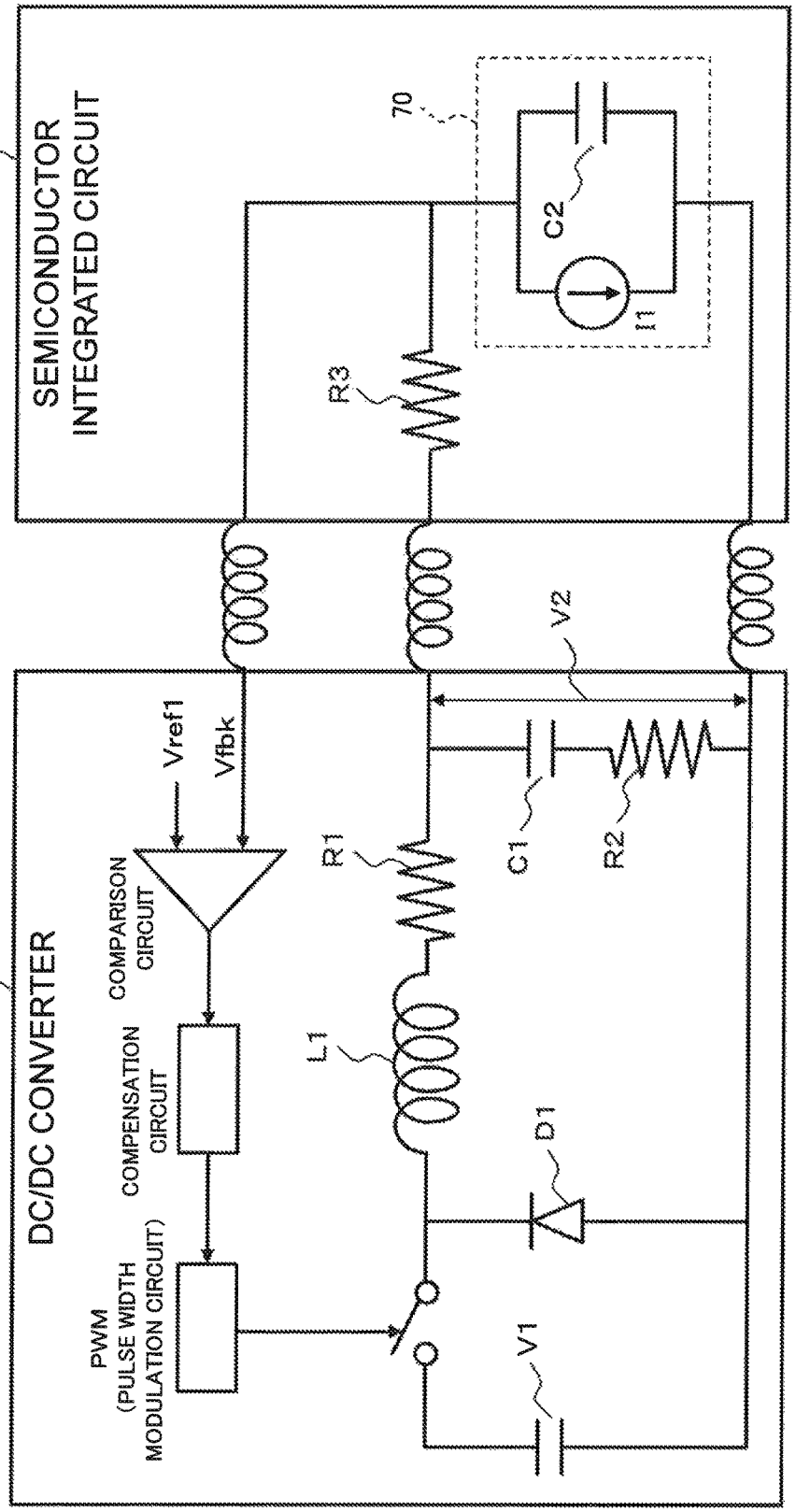
FIG. 6 is a diagram illustrating a configuration of a general semiconductor system.
Figure 7:
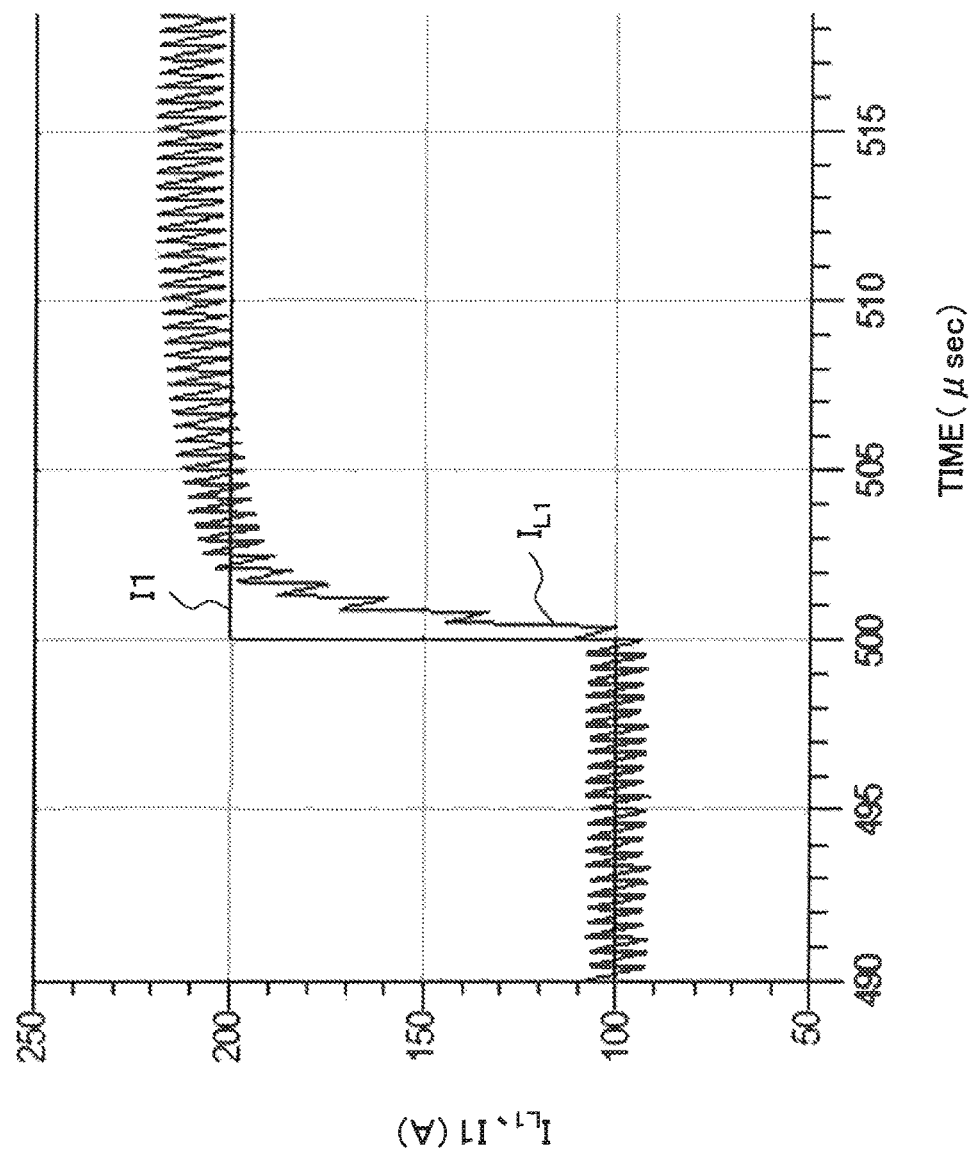
FIG. 7 is a diagram illustrating one example of sharp current change occurring in a semiconductor integrated circuit in the general semiconductor system.

In this example embodiment, since the semiconductor integrated circuit 10 includes the voltage comparison circuit 11 and the control circuit 12, when the electric source voltage V13 declines, the electric source voltage V13 rises faster than when the circuits 11 and 12 are not provided. For this reason, the voltage drop of the electric source voltage V13 when the circuits 11 and 12 are provided is suppressed as illustrated in FIG. 5, compared with the voltage drop like FIG. 8 when the circuits 11 and 12 are not provided.

In other words, the control by the control circuit 12 is control inside the semiconductor integrated circuit 10. Therefore, when the electric source voltage V13 declines to be lower than the reference voltage Vref2 for example, the circuit operation of the control circuit 12 suppresses the drop of an electric source voltage V13 at a time point earlier than in the stabilization control of the electric source voltage by the external electric source supply device 20. Then, first, the control of the control circuit 12 raises the electric source voltage V13, and thereafter, the stabilization control of the electric source voltage by the electric source supply device 20 is performed for stabilizing the electric source voltage V13 at the standard voltage Vref1.

Next, an advantageous effect of this example embodiment is described.

The semiconductor system 1 according to this example embodiment can reduce the sharp voltage noise in the semiconductor integrated circuit 10.

A reason for that is described. In this example embodiment, to the semiconductor integrated circuit 10, the electric source voltage is supplied from the electric source supply device 20 that controls the output voltage V2 based on the feedback voltage Vfbk of the electric source voltage V13 supplied to the load 13 and the standard voltage Vref1. Then, in the semiconductor integrated circuit 10, the voltage comparison circuit 11 compares the detected electric source voltage V13 with the reference voltage Vref2. Then, in the semiconductor integrated circuit 10, the control circuit 12 controls the electric source voltage V13 based on the result of the comparison by the voltage comparison circuit 11. The above is the reason.

Thus, in this example embodiment, in the semiconductor integrated circuit 10, the voltage comparison circuit 11 detects the noise level occurring in the electric source voltage V13. Then, when a noise that cannot be sufficiently followed by the external electric source supply device 20 occurs, the control circuit 12 of the semiconductor integrated circuit 10 controls the electric source voltage V13 in order to be raised according to the noise level. For example, when the control circuit 12 is constituted by the variable resistance, the control circuit 12 controls the resistance value of the variable resistance in such a way to be smaller as the noise level is larger. Thereby, in this example embodiment, the electric source voltage can be raised against the sharp voltage noise in a response time shorter than in the control to the standard voltage by the electric source supply device 20 connected to the outside of the semiconductor integrated circuit 10, and the voltage noise is reduced.

Note that the reference voltage Vref2 is desirably set as a value lower than the noise level which the control by the electric source supply device 20 can cope with, by taking into account the standard voltage Vref1. In other words, the noise level which the control by the electric source supply device 20 can cope with is a noise level of a degree that the control by the electric source supply device 20 can sufficiently and promptly compensate the voltage drop of the electric source voltage V13 even when the control by the control circuit 12 is not performed. When the reference voltage Vref2 is set as a value lower than this noise level, the control by the control circuit 12 is not performed even when the electric source voltage V13 in the semiconductor integrated circuit 10 declines unless the electric source voltage V13 declines down to the reference voltage Vref2. Thus, it is expected that the voltage drop of the electric source voltage V13 is compensated sufficiently and promptly by the control by the electric source supply device 20 even when the control by the control circuit 12 is not performed.

Note that the present invention is not limited to the above-described example embodiment, and can be variously configured to be embodied. For example, in the above-described example embodiment, the example in which the electric source supply device 20 is constituted by a DC/DC converter is described, but not limited to this. Further, in the above-described example embodiment, the example in which the control circuit 12 is constituted by a variable resistance is described, but not limited to this.

Further, although in the above-described example embodiment, the electric source voltage V13 is detected as the detection voltage (the feedback voltage Vfbk), a divided voltage of the electric source voltage V13 may be detected as the detection voltage (the feedback voltage Vfbk). In this case, by taking into account that the detection voltage is the divided voltage of the electric source voltage, the standard voltage Vref1 and the reference voltage Vref2 are set.

Figure 10:
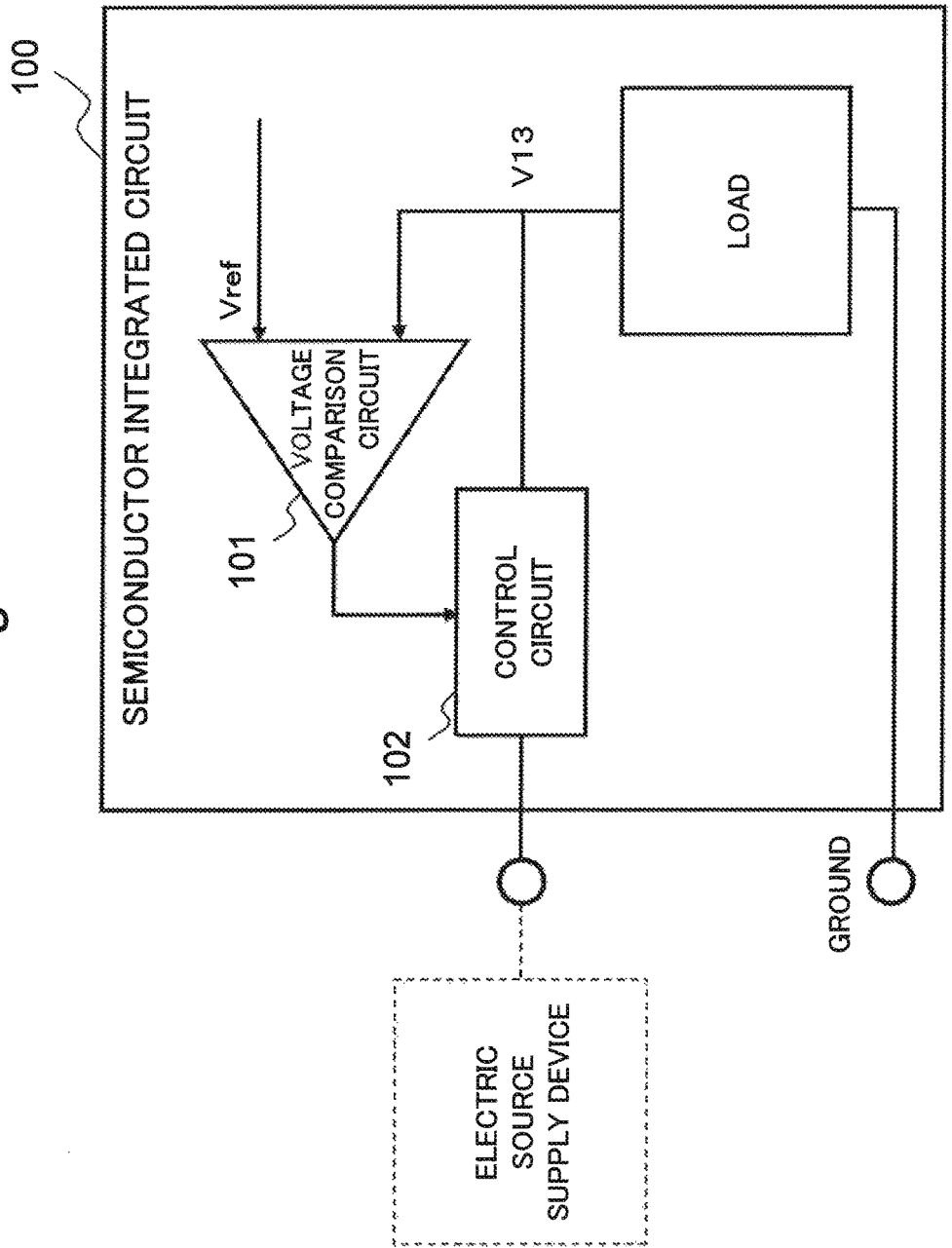
FIG. 10 is a diagram illustrating a minimum configuration according to the example embodiment of the present invention.

Furthermore, FIG. 10 illustrates another example embodiment of a semiconductor integrated circuit according to the present invention. A semiconductor integrated circuit 100 illustrated in FIG. 10 includes a voltage comparison circuit 101 and a control circuit 102.

The voltage comparison circuit 101 includes a circuit configuration of comparing a reference voltage Vref with a detection voltage Vk. The detection voltage Vk is a detected result of an electric source voltage supplied from an electric source supply device supplying the electric source voltage. The reference voltage Vref is set as a voltage value lower than a standard voltage used in stabilization control that the electric source supply device performs for stabilizing the electric source voltage.

The control circuit 102 includes a circuit configuration of performing control of compensating a voltage drop of the electric source voltage when the detection voltage Vk is lower than the reference voltage Vref based on a result of the comparison by the voltage comparison circuit 101.

The semiconductor integrated circuit 100 operates as follows. In other words, the voltage comparison circuit 101 compares the detection voltage Vk with the reference voltage Vref, and outputs the comparison result to the control circuit 102. Based on the received comparison result, the control circuit 102 performs control of compensating a voltage drop of an electric source voltage when a detection voltage Vk is lower than the reference voltage Vref.

Thereby, the semiconductor integrated circuit 100 can reduce a sharp voltage noise of the electric source voltage in its own circuit. When the sharp voltage noise occurs in the electric source voltage, the semiconductor integrated circuit 100 can deal with the voltage noise promptly. Therefore, the semiconductor integrated circuit 100 can suppress the voltage noise and stabilize the electric source voltage promptly.

The invention claimed is:

1. A semiconductor integrated circuit comprising:
a voltage comparison circuit that compares a detection voltage with a reference voltage, the detection voltage being a detected result of an electric source voltage supplied from an electric source supply device supplying the electric source voltage, the reference voltage being set to be lower than a standard voltage used in stabilization control that the electric source supply device performs for stabilizing the electric source voltage; and
a control circuit that performs control of compensating a voltage drop of the electric source voltage when the detection voltage is lower than the reference voltage based on a result of comparison by the voltage comparison circuit,
wherein the control circuit is configured to raise the electric source voltage depending on a noise level representing a degree at which the detection voltage is lower than the reference voltage,
and wherein the control circuit includes a variable resistance arranged on a supply path of the electric source voltage, and is configured to raise the electric source voltage by varying a resistance value of the variable resistance in such a way that the resistance value becomes lower than a standard value, depending on a noise level representing the degree at which the detection voltage is lower than the reference voltage.

2. A semiconductor system comprising:
an electric source supply device that outputs an electric source voltage; and
a semiconductor integrated circuit to which the electric source voltage is supplied from the electric source supply device, wherein
the semiconductor integrated circuit includes:
a voltage comparison circuit that compares a detection voltage with a reference voltage, the detection voltage being a detected result of the electric source voltage supplied from the electric source supply device, the reference voltage being set to be lower than a standard voltage used in stabilization control that the electric source supply device performs for stabilizing the electric source voltage; and
a control circuit that performs control of compensating a voltage drop of the electric source voltage when the detection voltage is lower than the reference voltage based on a result of comparison by the voltage comparison circuit,
wherein the control circuit is configured to raise the electric source voltage depending on a noise level representing a degree at which the detection voltage is lower than the reference voltage,
and wherein the control circuit includes a variable resistance arranged on a supply path of the electric source voltage, and is configured to raise the electric source voltage by varying a resistance value of the variable resistance in such a way that the resistance value becomes lower than a standard value, depending on a noise level representing the degree at which the detection voltage is lower than the reference voltage.

3. An electric source voltage control method comprising:
comparing a detection voltage with a reference voltage, the detection voltage being a detected result of an electric source voltage supplied from an electric source supply device supplying the electric source voltage, the reference voltage being set to be lower than a standard voltage used in stabilization control that the electric source supply device performs for stabilizing the electric source voltage; and
performing control of compensating a voltage drop of the electric source voltage when the detection voltage is lower than the reference voltage based on a result of comparison, wherein performing the control raises the electric source voltage depending on a noise level representing a degree at which the detection voltage is lower than the reference voltage, and wherein performing the control raises the electric source voltage arranged on a supply path of the electric source voltage by varying a resistance value of a variable resistance in such a way that the resistance value becomes lower than a standard value, depending on a noise level representing the degree at which the detection voltage is lower than the reference voltage.

* * * * *